US012603566B2

(12) United States Patent
Teggatz

(10) Patent No.: US 12,603,566 B2
(45) Date of Patent: Apr. 14, 2026

(54) REVERSE RECOVERY CHARGE REDUCTION CIRCUIT

(71) Applicant: Retela Leasing, LLC, The Colony, TX (US)

(72) Inventor: Ross Teggatz, The Colony, TX (US)

(73) Assignee: Retela Leasing, LLC, The Colony, TX (US)

( * ) Notice: Subject to any disclaimer, the term of this patent is extended or adjusted under 35 U.S.C. 154(b) by 104 days.

(21) Appl. No.: 17/735,208

(22) Filed: May 3, 2022

(65) Prior Publication Data

US 2022/0352812 A1 Nov. 3, 2022

Related U.S. Application Data

(60) Provisional application No. 63/183,286, filed on May 3, 2021.

(51) Int. Cl.
H02M 1/32 (2007.01)
H02M 1/00 (2006.01)

(52) U.S. Cl.
CPC ........... H02M 1/32 (2013.01); H02M 1/0051 (2021.05); H03K 2217/0018 (2013.01)

(58) Field of Classification Search
CPC ........ H02M 1/32; H02M 1/0051; H02M 1/08; H02M 3/158
See application file for complete search history.

(56) References Cited

U.S. PATENT DOCUMENTS

| | | | | | |
|---|---|---|---|---|---|
| 10,886,853 | B1 * | 1/2021 | Xu | ........................... | H02M 1/08 |
| 2001/0019278 | A1 * | 9/2001 | Sudo | ..................... | H02M 3/155 |
| | | | | | 323/282 |

| | | | | |
|---|---|---|---|---|
| 2008/0084197 | A1 | 4/2008 | Williams et al. | |
| 2008/0094124 | A1 * | 4/2008 | Heppenstall | ..... H03K 17/08122 |
| | | | | 327/530 |
| 2009/0289708 | A1 | 11/2009 | Beale et al. | |
| 2012/0087167 | A1 | 4/2012 | Kuzumaki et al. | |
| 2017/0207782 | A1 | 7/2017 | Takazawa | |
| 2018/0006569 | A1 | 1/2018 | Kikuchi | |

(Continued)

FOREIGN PATENT DOCUMENTS

| | | | | |
|---|---|---|---|---|
| CN | 111404526 B | * | 12/2021 | .............. H02M 1/08 |
| JP | 2006050858 A | * | 2/2006 | |

OTHER PUBLICATIONS

R. Elferich and T. Lopez, "Impact of gate voltage bias on reverse recovery losses of power MOSFETs," Twenty-First Annual IEEE Applied Power Electronics Conference and Exposition, 2006. APEC '06., Dallas, TX, USA, 2006, pp. 1390-1395 (Year: 2006).*

(Continued)

*Primary Examiner* — Jue Zhang
*Assistant Examiner* — Jye-June Lee
(74) *Attorney, Agent, or Firm* — Daniel J. Chalker; Edwin S. Flores; Chalker Flores, LLP

(57) ABSTRACT

A method for reducing or eliminating current and voltage transients in a device including: providing the device, wherein the device comprises a transistor with a gate; and controlling the gate, wherein the gate is turned off to a non-zero value in a presence of the positive current flow and wherein the gate is turned on in a presence of the negative current flow; reducing the negative current flow; and reducing or eliminating current and voltage transients in the device.

26 Claims, 19 Drawing Sheets

(56) References Cited

U.S. PATENT DOCUMENTS

| | | |
|---|---|---|
| 2019/0140630 A1 | 5/2019 | Chen et al. |
| 2021/0058001 A1* | 2/2021 | Dou .................... H02M 3/1588 |
| 2021/0091668 A1 | 3/2021 | Buhari et al. |
| 2023/0283209 A1 | 9/2023 | Liu et al. |

OTHER PUBLICATIONS

International Search Report and Written Opinion from the USPTO for PCT/US2022/27377 dated Aug. 16, 2022, 18 pp.

Hoang, N.K., et al., "A zero current detector with low negative inductor current using forced freewheel switch operation in synchronous DC-DC converter," 2014 IEEE Fifth International Conference on Communications and Electronics (ICCE), 2014, pp. 318-322.

International Search Report and Written Opinion from the USPTO for PCT/US2025/041771 dated Nov. 25, 2025, 29 pp.

\* cited by examiner

Vbias $<$ V$_T$

I$_x$ = 0

No or Partial Qrr:
I2 x Rdson < Vf
Full Qrr:
I2 x Rdson > Vf

910 ⟶ VgsL

955

Vmid

965

950 ⟶ VdsL

0V

VDSA (Max)

960

970

972

930 ⟶ VgsH

A

975 ⟶ VgsL

990

980 ⟶ VdsL

0V

VDSB (Max)

997

992

995

985 ⟶ VgsH

B

VDS(Max) B > VDS(Max) A
Power loss in "B" is larger

1125 ⟶ $V_{bias1}$

1130 ⟶ $V_{bias2}$

1135

1140

1125 ⟶ V$_{bias1b}$

1130 ⟶ V$_{bias2b}$

1145

1150

REVERSE RECOVERY CHARGE REDUCTION CIRCUIT

CROSS-REFERENCE TO RELATED APPLICATIONS

This application claims priority to U.S. Provisional Application No. 63/183,286 filed on May 3, 2021, the contents of each of which are incorporated by reference herein.

STATEMENT OF FEDERALLY FUNDED RESEARCH

Not applicable.

TECHNICAL FIELD OF THE INVENTION

The present invention relates in general to power switching applications. In particular, the present invention relates to reducing or eliminating current and voltage transients and the negative effects of current and voltage transients in power switching applications.

BACKGROUND OF THE INVENTION

Reverse recovery charge is a challenge in all power switching applications, for example, motor control, solenoid control, or power management. Reverse recovery charge is stored at the junction of the body diode of a switch in a power switching application when the body diode is being forward biased. This charge increases as the forward bias current increases. Ideally, when a forward biased diode is suddenly put into reverse bias there will be no current flow in the reverse bias. However, with reverse recovery charged stored, when the forward biased diode is suddenly put into the reverse bias there will be a reverse current flow which will be a function of the charge that was stored when operating in the forward bias. The current and voltage transients caused by this reverse recovery charge cause a number of problems in power switching applications.

SUMMARY OF THE INVENTION

In one embodiment, the present invention includes a method for reducing or eliminating current or voltage transients in a device comprising: providing the device, wherein the device comprises a transistor with a gate; and controlling the gate, wherein the gate is turned off to a non-zero value in a presence of a positive current flow and wherein the gate is turned on in a presence of a negative current flow; thereby reducing or eliminating current or voltage transients in the device. In one aspect, method further comprises selecting a threshold voltage of the transistor, a reverse-threshold voltage of the device, or both to optimize controlling the gate. In another aspect, the device comprises gallium nitride or gallium arsenide. In another aspect, the transistor incorporates a body diode and a backgate, and a reverse turn-on voltage of the device is less than a forward threshold voltage of the body diode; and further comprises applying a selected backgate bias voltage to the backgate to lower a reverse-threshold voltage. In another aspect, the transistor is formed in or on silicon, silicon carbide, gallium nitride, or gallium arsenide.

In another embodiment, the present invention includes a method for reducing or eliminating current or voltage transients in a switch comprising: providing the switch, wherein the switch comprises a transistor with a gate; and controlling the switch, wherein in a presence of a forward current, (1) a turn-off voltage of the switch is a bias voltage greater than zero and less than a threshold voltage of the transistor and (2) the turn-off voltage is applied to the gate to turn off the switch, preventing the forward current flow through the transistor; wherein in a presence of a reverse current, (1) a reverse turn-on voltage of the transistor is greater than a reverse-threshold voltage of the transistor and (2) a turn-on voltage is applied to the gate to turn on the switch, allowing a negative current flow through the transistor, thereby reducing or eliminating current or voltage transients. In one aspect, method further comprises selecting the threshold voltage, the reverse-threshold voltage, or both to optimize controlling the switch. In another aspect, the transistor is formed in or on gallium nitride or gallium arsenide. In another aspect, the transistor incorporates a body diode and a backgate, and the reverse turn-on voltage is less than a forward threshold voltage of the body diode; and further comprising applying a selected backgate bias voltage to the backgate to lower the reverse-threshold voltage. In another aspect, the transistor comprises silicon, silicon carbide, gallium nitride, or gallium arsenide.

In another embodiment, the present invention includes a method for reducing or eliminating current or voltage transients in a switch comprising: providing the switch, wherein the switch comprises a transistor with a gate; and controlling the switch, wherein in a presence of a forward current, (1) a turn-off voltage of the switch is a bias voltage greater than zero and less than a threshold voltage of the transistor and (2) the turn-off voltage is applied to the gate to turn off the switch, preventing the forward current flow through the transistor; wherein in a presence of a reverse current, (1) a reverse turn-on voltage of the transistor is greater than a reverse-threshold voltage of the transistor and (2) a turn-on voltage is applied to the gate to turn on the switch, allowing a negative current flow through the transistor, thereby reducing or eliminating current or voltage transients. In one aspect, the method further comprises selecting the threshold voltage, the reverse-threshold voltage, or both to optimize controlling the switch. In another aspect, the transistor is formed in or on gallium nitride or gallium arsenide. In another aspect, the transistor incorporates a body diode and a backgate, and the reverse turn-on voltage is less than a forward threshold voltage of the body diode; and further comprising applying a selected backgate bias voltage to the backgate to lower the reverse-threshold voltage. In another aspect, the transistor comprises silicon, silicon carbide, gallium nitride, or gallium arsenide.

In another embodiment, the present invention includes a switch comprising: a transistor comprising a gate; wherein in a presence of a forward current (1) a turn-off voltage of the switch is a bias voltage that is greater than zero and less than a threshold voltage of the transistor and (2) when the turn-off voltage is applied to the gate, the forward current will not flow through the transistor; and wherein in a presence of a reverse current, (1) a reverse turn-on voltage of the transistor is greater than a reverse-threshold voltage of the transistor and (2) a turn-on voltage is applied to the gate to turn on the switch, allowing a negative current flow through the transistor, thereby reducing or eliminating current or voltage transients, wherein current and voltage transients are reduced or eliminated. In one aspect, the switch further comprises selecting the threshold voltage, the reverse-threshold voltage, or both to optimize controlling the switch. In another aspect, the transistor comprises gallium nitride or gallium arsenide In another aspect, the transistor incorporates a body diode and a backgate and the reverse-threshold voltage is lowered when a selected back-gate bias voltage is applied to the backgate, the reverse current will not flow through the body diode, a reverse recovery charge will not accumulate at the body diode, and the reverse turn-on voltage is less than a forward threshold voltage of the body diode. In another aspect, the transistor is formed in or on silicon, silicon carbide, gallium nitride, or gallium arsenide.

In another embodiment, the present invention includes a power converter comprising: a switch comprising: a transistor comprising a gate; wherein in a presence of a forward current (1) a turn-off voltage of the switch is a bias voltage that is greater than zero and less than a threshold voltage of the transistor and (2) when the turn-off voltage is applied to the gate, the forward current will not flow through the transistor; and wherein in a presence of a reverse current, (1) a reverse turn-on voltage of the transistor is greater than a reverse-threshold voltage of the transistor and (2) a turn-on voltage is applied to the gate to turn on the switch, allowing a negative current flow through the transistor, thereby reducing or eliminating current or voltage transients, wherein current and voltage transients are reduced or eliminated.

In another embodiment, the present invention includes a kit comprising: a switch comprising: a transistor comprising a gate; wherein in a presence of a forward current (1) a turn-off voltage of the switch is a bias voltage that is greater than zero and less than a threshold voltage of the transistor and (2) when the turn-off voltage is applied to the gate, the forward current will not flow through the transistor; and wherein in a presence of a reverse current, (1) a reverse turn-on voltage of the transistor is greater than a reverse-threshold voltage of the transistor and (2) a turn-on voltage is applied to the gate to turn on the switch, allowing a negative current flow through the transistor, thereby reducing or eliminating current or voltage transients, wherein current and voltage transients are reduced or eliminated.

BRIEF DESCRIPTION OF THE DRAWINGS

For a more complete understanding of the features and advantages of the present invention, reference is now made to the detailed description of the invention along with the accompanying figures, in which.

DETAILED DESCRIPTION OF THE INVENTION

Illustrative embodiments of the system of the present application are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

In the specification, reference may be made to the spatial relationships between various components and to the spatial orientation of various aspects of components as the devices are depicted in the attached drawings. However, as will be recognized by those skilled in the art after a complete reading of the present application, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

Figure 1A:
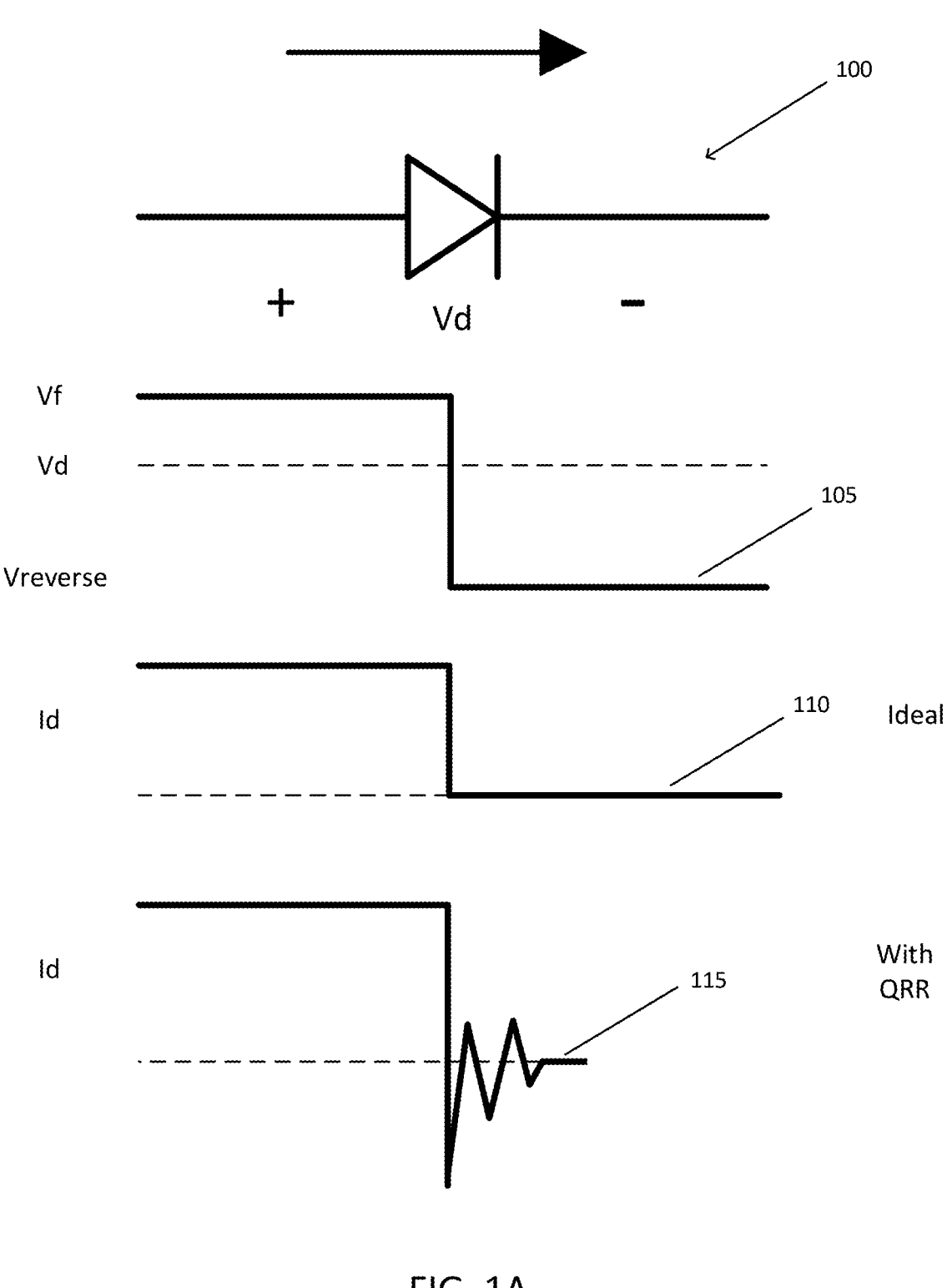
FIG. 1A shows a diode and the behavior over time of voltage and current in the diode.
Figure 1B:
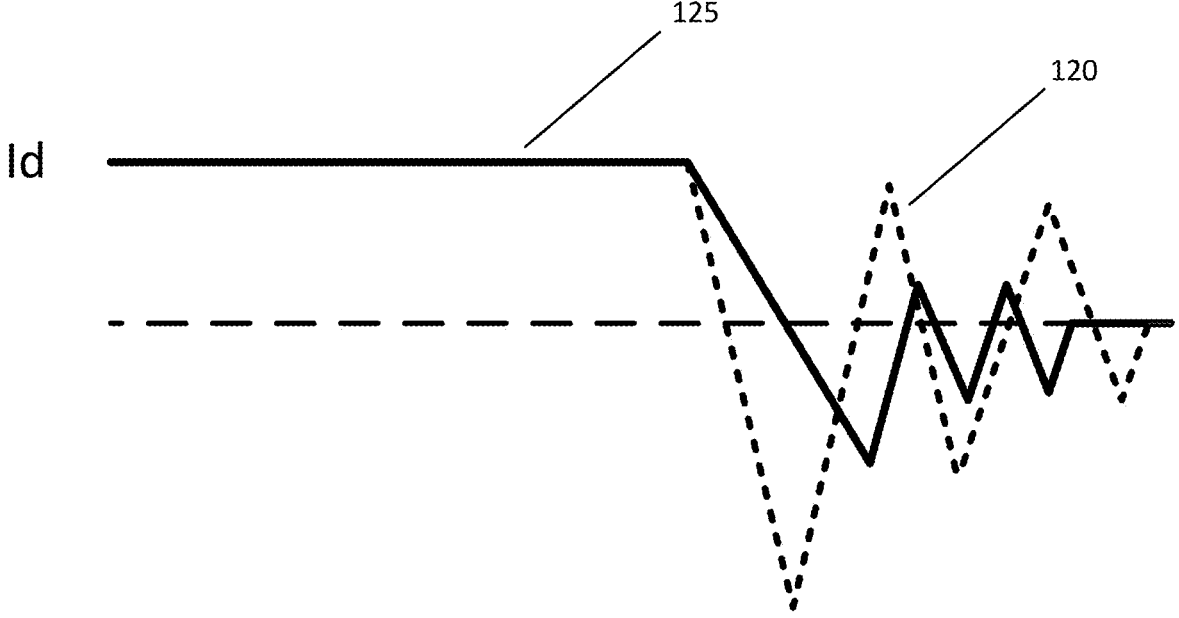
FIG. 1B shows the behavior over time of current in the diode of FIG. 1B at different transition times.

Reverse recovery time is a challenge in all power switching applications, whether it is motor control, solenoid control, or power management. Reverse recovery charge is stored at the junction of the diode when it is being forward biased. (FIG. 1A). The level of charge increases as the forward bias current increases. Ideally, when a forward biased diode is suddenly put into reverse bias there will be no current flow in the reverse bias. However, with reverse recovery charged stored, when the forward biased diode is suddenly put into the reverse bias there will be a reverse current flow, which will be a function of the charge that was stored when operating in the forward bias. If the transition time from forward bias to reverse bias is decreased the current peak from reverse recovery will increase. (FIG. 1B).

FIG. 1A shows a diode 100 with a threshold voltage of $V_d$ and a forward current flowng through it (as denoted by the arrow above the diode 100). Voltage 105 is the behavior of a voltage across the diode 100 over time as the voltage 105 is switched from a forward bias voltage $V_f$ to a reverse bias voltage $V_{reverse}$. Ideal current $I_d$ 110 is the behavior of a current through the diode 100 as an ideal diode over time as the voltage 105 is switched from the forward bias voltage $V_f$ to the reverse bias voltage $V_{reverse}$, with the ideal current $I_d$ 110 flowing while the voltage 105 is at $V_f$ and with the ideal current $I_d$ 100 not flowing while the voltage 105 is at $V_{reverse}$. Practical current $I_d$ 115 is the behavior of a current through a realistic, practical diode 100 over time as the voltage 105 is switched from the forward bias voltage $V_f$ to the reverse bias voltage $V_{reverse}$, with the practical current $I_d$ 115 flowing while the voltage 105 is at $V_f$ and oscillating and diminishing to zero current when the diode 105 is switched to the reverse bias voltage $V_{reverse}$ because a reverse recovery charge $Q_{rr}$ is stored at the junction of the diode 100 while the practical current $I_d$ 115 is flowing while the voltage 105 is at the forward bias voltage $V_f$ and flows as a diminishing, oscillating transient current $I_d$ 115 for a short period after the switch from $V_f$ to $V_{reverse}$. As shown in FIG. 1B, the peak of the transient practical current $I_d$ increases as a transition time from $V_f$ to $V_{reverse}$ is decreased, with the practical current $I_d$ 120, shown as a dashed line, having a relatively higher peak at a relatively short transition time and the practical current $I_d$ 125, shown as a solid line, having a relatively lower peak at a relatively longer transition time.

Figure 2A:
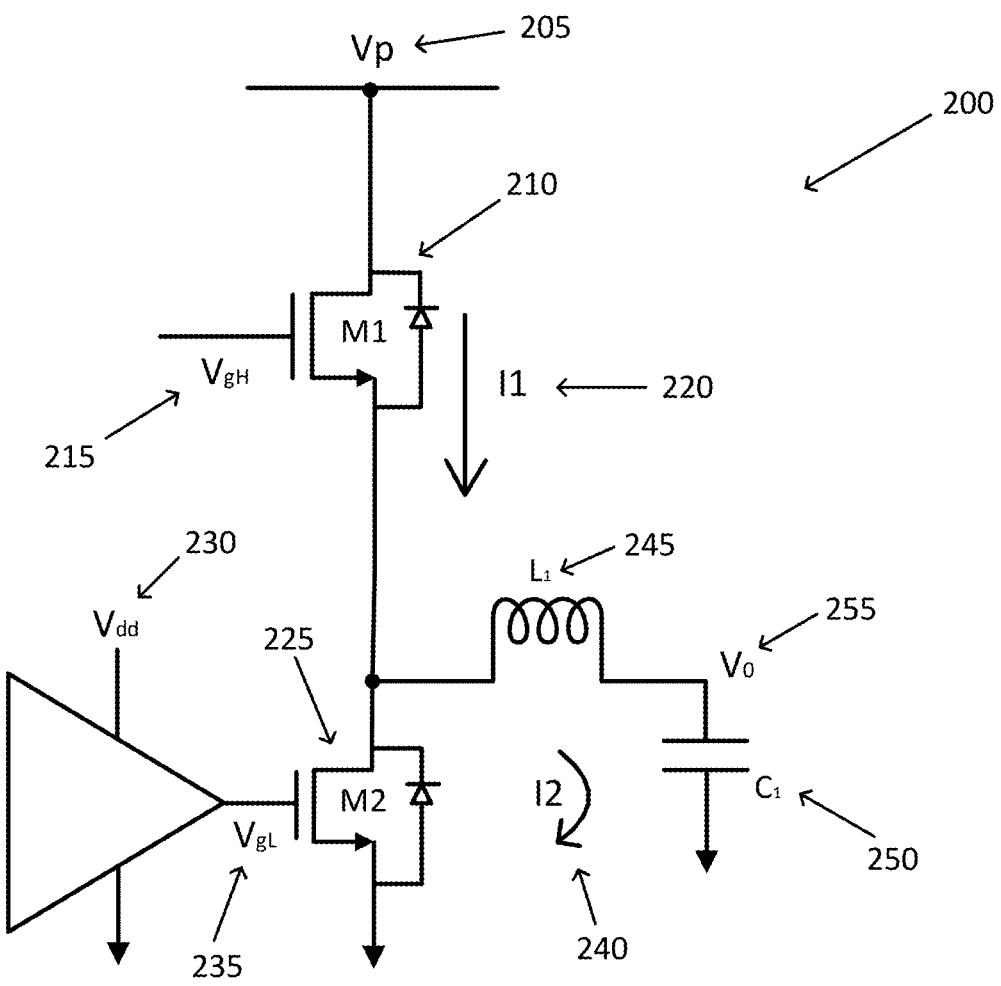
FIG. 2A shows a prior art power switching circuit.

FIG. 2A shows a prior art power switching circuit 200 such as that in a buck-switching regulator application, with a totem pole switch configuration including the high switch M1 210 and the low switch M2 225. The high switch M1 220 and the low switch M2 225 are each shown as an exemplary metal-oxide semiconducting field-effect transistor (MOSFET) with a body diode, the parasitic diode that is intrinsic to the MOSFETs of the high switch M1 220 and of the low switch M2 225 as shown in FIG. 2A. More particularly, the power switching curcuit 200 includes the input for input power supply voltage $V_p$ 205, the high switch M1 210, the input for the high gate voltage $V_{gH}$ 215, the forward current $I_1$ 220, the low switch M2 225, the voltage source $V_{dd}$ 230 for the low gate voltage $V_{gL}$, 235, the reverse current $I_2$ 240, the load inductor $L_1$ 245, the load capacitor $C_1$ 250, and the output for the output voltage $V_0$ 255.

In the representative prior art power switching circuit 200, to improve efficiency, the low switch $M_2$ 225 is on the ON state when the current $I_2$ is freewheeling through the load inductor $L_1$ 245 and the load capacitor $C_1$ 250. When the output voltage $V_0$ 255 decreases, more energy must be provided from the inpur power supply by inputting the input power supply voltage $V_p$ 205, by switching the high switch M1 210 to the ON state. To prevent a shoot-through current from the high switch M1 210 to the low switch M2 225, the low switch M2 225 must be switched to the OFF state before the high switch Ml 210 is switched to the ON state. The time period during which both the high switch M1 210 and the low switch M2 225 are in the OFF state is the deadtime. To switch the low switch M2 225 to the OFF state, the voltage source $V_{dd}$ 230 is transitioned to 0 volts. During the deadtime that starts when the low switch M2 225 is switched to the OFF state, a reverse recovery charge $Q_{rr}$ accumulates at the forward bias junction of the body diode of the low switch M2 225. When the high switch M1 210 is switched to the ON state, ending the deadtime, the reverse recovery charge $Q_{rr}$ and the forward current $I_1$ 220 flow through the high switch M1 210. To minimize the peak and the $dI_{rr}/dt$ of the reverese recovery charge $Q_{rr}$ that was accumulated in the body diode of the low switch M2 225, the transition time from the OFF state to the ON state can be increased as shown for the practical current $I_d$ 125 in FIG. 1B, but at the cost of increased switching losses and a reduction in power efficiency.

Figure 2B:
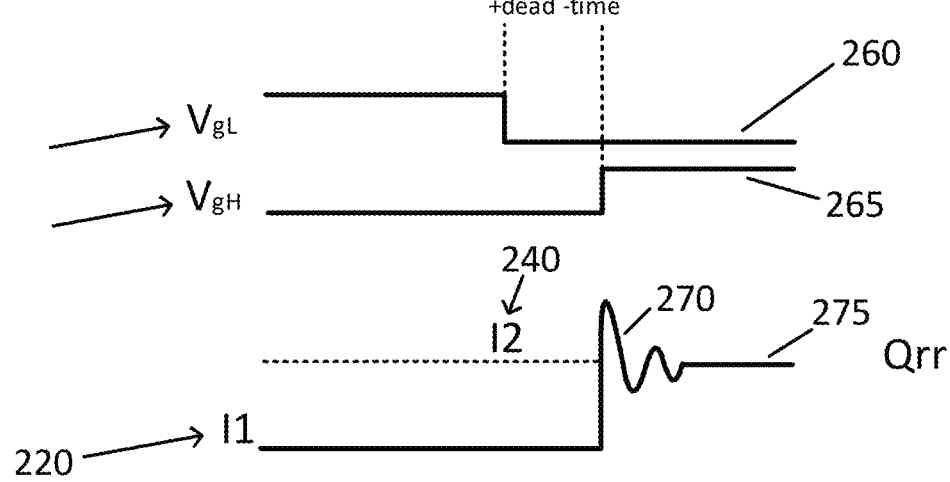
FIG. 2B shows the behavior over time of behavior over time of voltage and current in the prior art power switching application shown in FIG. 2A.

FIG. 2B shows the behavior over time of the low gate voltage $V_{gL}$ 235, shown as the low gate voltage $V_{gL}$ curve 260; the high gate voltage $V_{gH}$ 215, shown as the high gate voltage $V_{gH}$ curve 265; and the current $I_1$ 220 and the current $I_2$ 240, shown together as the current curve 275. The current $I_1$ flows as the low gate voltage is set to 0 V, beginning the deadtime. When the high gate voltage $V_{gH}$ 215 is set to switch the high switch M1 210 to the ON state, the deadtime ends and the reverse recovery charge flows as the transient portion 270 of the current curve 275.

Figure 3A:
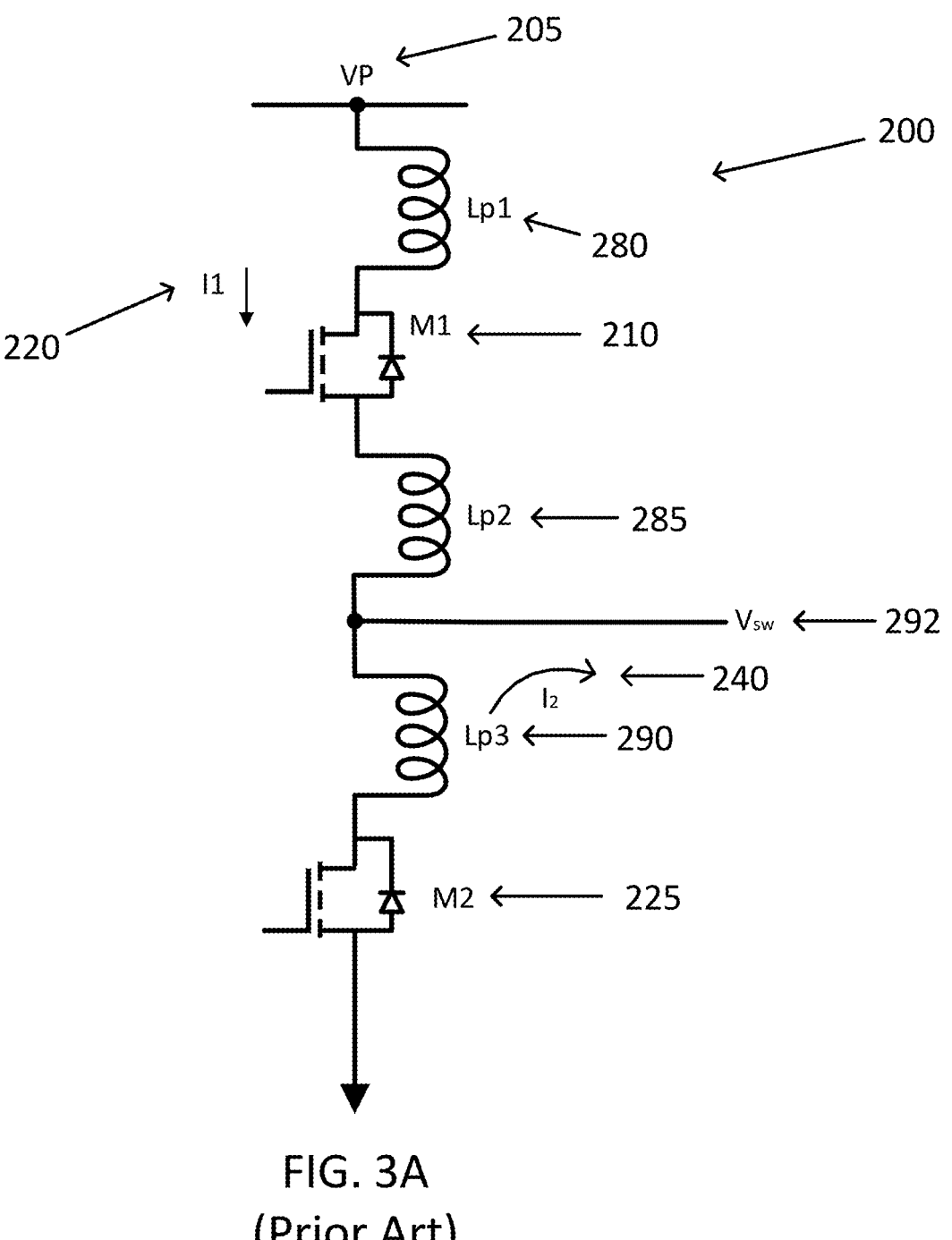
FIG. 3A shows shows the prior art power switching circuit of FIG. 2A with parasitic inductances.

FIG. 3A shows the representative prior art power switching circuit 200 with the high switch M1 210, the low switch M2 225, the current $I_1$ 220, the current $I_2$ 240, the parasitic inductance $L_{p1}$ 280, the parasitic inductance $L_{p2}$ 285, the parasitic inductance $L_{p3}$ 290, and the output switch pin voltage $V_{sw}$ 292 between the parasitic inductance $L_{p2}$ 285 and the parasitic inductance $L_{p3}$ 290. The product of (1) the sum $L_{psum}$ of the parasitic inductances $L_{p1}$ 280, $L_{p2}$ 285, and $L_{p3}$ 290 and (2) the $dI_{rr}/dt$ of the reverese recovery charge $Q_{rr}$ that was accumulated in the body diode of the low switch M2 225 translates to a parasitic inductance voltage transient. The high switch M1 210 must be able to withstand the peak of this parasitc inductance voltage transient, but as the breakdown voltage of the high switch M1 210 is increased, the overall product of (1) the drain-to-source resistance $R_{dsON}$ of the high switch M1 210 in the ON state and (2) the area of the high switch M1 210 increases, and to keep efficiency lower, the size of the high switch M1 210 must be increased. These considerations require trade-offs to be made in the types and sizes of the high switch M1 210 and the low switch M2 225, management of board layout to minimize parasitics, and switching characteristics of the output of the representative prior art power switching circuit 200.

Figure 3B:
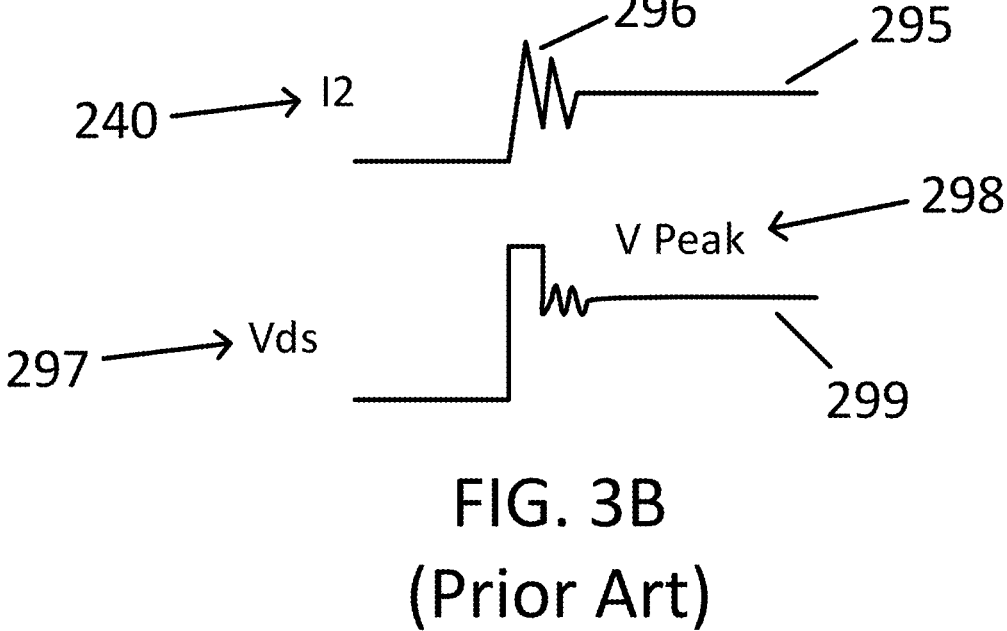
FIG. 3B shows the behavior over time of behavior over time of voltage and current in the prior art power switching application as shown in FIG. 3A.

FIG. 3B shows the behavior over time of the current $I_2$ 240, shown as the current $I_2$ curve 295, and the drain-to source voltage of the high switch M1 210 $V_{ds}$ 297, shown as the voltage $V_{ds}$ curve 299. When the high switch M1 210 is switched to the ON state, the deadtime ends, the reverse recovery charge $Q_{rr}$ flows as the transient portion 296 of the current $I_2$ curve 295, and the drain-to source voltage of the high switch M1 210 $V_{ds}$ 297 increases, including the parasitic inductance voltage transient peak 298.

Figure 4:
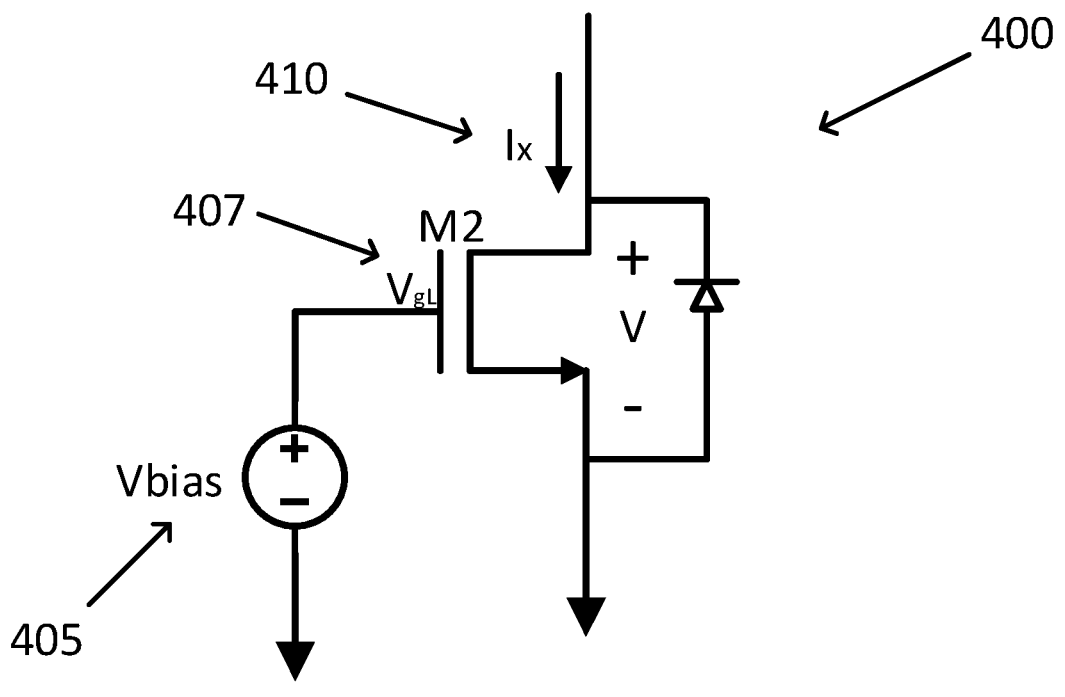
FIG. 4 shows an embodiment of the present invention, a low switch of a power switching application.

The solution to this problem is to eliminate or reduce the reverse recovery charge that can be stored. The elimination of reduction of the reverse recovery charge is achieved by gate controlling the turn-off voltage level of device M2. As shown in FIG. 4, the gate of device M2 is turned-off with a Vbias level. The Vbias is set to a voltage lower than the threshold voltage (Vt) of M2. Therefore, if a positive voltage were placed at the drain, no current, Ix, will flow through M2 from drain to source.

FIG. 4 shows an embodiment of the present invention, the low switch M2 400 of a power switching application. The low switch M2 400 includes a MOSFET with a body diode. The voltage source for the bias voltage $V_{bias}$ 405 is also shown and is connected to the input for the low switch gate voltage $V_{gL}$ 407. The current $I_X$ is also shown. The low switch M2 400 presents a solution to problems associated with the reverse recovery charge $Q_{rr}$ by gate controlling the turn-off voltage level of the low switch M2 400. The gate of the low switch M2 400 is switched to the OFF state with a bias voltage $V_{bias}$ 405 by setting the bias voltage $V_{bias}$ 405 to a voltage lower than the forward threshold voltage $V_t$ of the low switch M2 400. If a positive voltage is placed at the drain of the low switch M2 400, the current $I_X$ 410 will be zero, i.e., no current $I_X$ 410 will flow from the drain to the source of the low switch M2 400.

Figure 5:
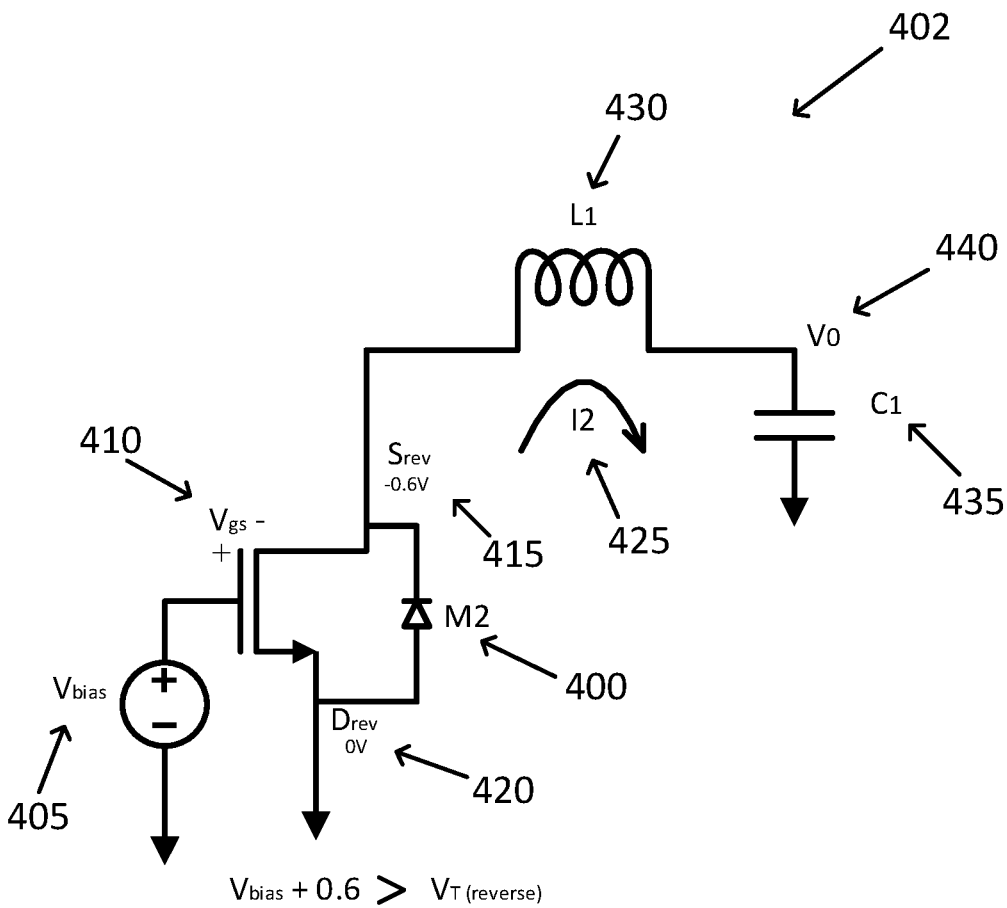
FIG. 5 shows the low switch of FIG. 4 in reverse-bias mode.

FIG. 5 shows the low switch M2 400, with the voltage source for the bias voltage $V_{bias}$ 405, the gate-to-source voltage $V_{gs}$ 410 for the low switch M2 400, the reverse source voltage $S_{rev}$ 415, and the reverse drain voltage $D_{rev}$ 420, and the current $I_2$ 425. FIG. 5 also shows connected to the load inductor $L_1$ 430, the load capacitor $C_1$ 435, and the output for the output voltage $V_O$ 440. In the recirculation mode of a power switching device of which the low switch M2 400 is a component, the current $I_2$ will flow as shown, and in the low switch M2 400, the source and the drain reverse to become the reverse drain and the reverse source, respectively. The reverse drain voltage $D_{rev}$ 420 is shown grounded at 0 volts. The reverse threshold voltage of the low switch M2 400 $V_{t-reverse}$ will be less than the forward threshold voltage $V_t$ because the backgate biasing, i.e., the bias voltage applied to the body diode, for the forward and reverse modes of the low switch M2 400 are at different voltages with respect to the source voltage in the forward mode and the reverse source voltage $S_{rev}$ 415 for the reverse mode. With the reverse drain voltage $D_{rev}$ 420 grounded at 0 volts, the reverse source voltage $S_{rev}$ 415 will be a negative voltage. To eliminate the accumulation of the reverse recovery charge $Q_{rr}$ as described herein, the reverse-drain-to-reverse-source voltage should not be greater than the forward bias voltage of the body diode. The forward bias voltage of the body diode may typically be +0.6 V. To assure that the body diode is not forward biased, the gate-to-source voltage $V_{gs}$ 410 minus the reverse threshold voltage $V_{t-reverse}$ must be large enough to switch the low switch M2 400 to the reverse-biased-ON state. FIG. 5 shows a representative value for the reverse source voltage $S_{rev}$=−0.6 V and for the grounded reverse drain voltage $D_{rev}$=0 V when the forward bias voltage of the body diode is a typical +0.6 V. Thus, the reverse-drain-to-reverse-source voltage $D_{rev}$−$S_{rev}$=0 V−(−0.6 V)=+0.6 V. When the overall gate-to-reverse-source voltage $V_{bias}$−$S_{rev}$=$V_{bias}$−(−0.6 V)=$V_{bias}$+0.6 V is greater than the reverse threshold voltage $V_{t-reverse}$, the low switch M2 400 is switched to the reverse-bias-ON state and the accumulation of of the reverse recovery charge is eliminated.

Figure 6:
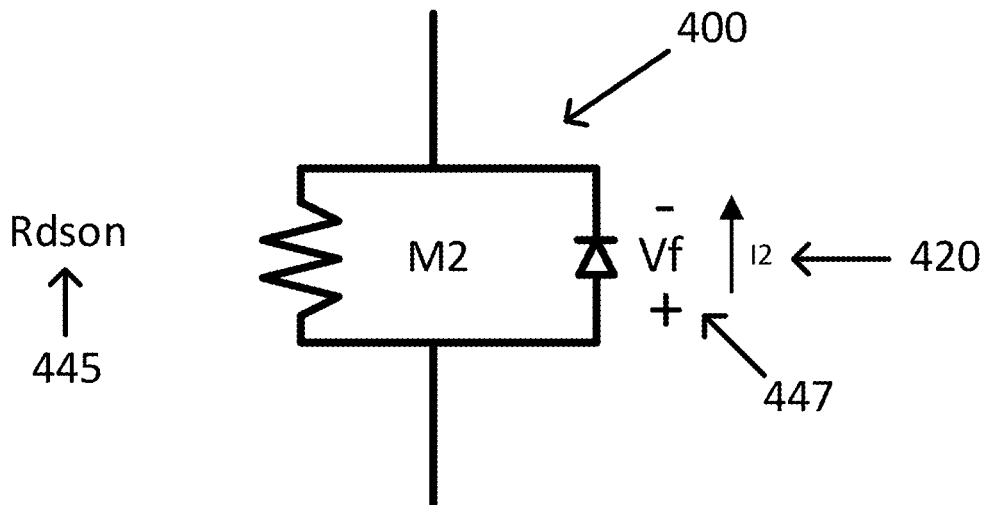
FIG. 6 shows a resistance drive of the low switch of FIG. 5.

FIG. 6 shows that the gate-to-source voltage $V_{gs}$ 410 creates a resistance drive $R_{dson}$ 445 for the low switch M2 400 in the reverse-bias-ON state. The product of (1) the resistance $R_{dson}$ 445 and (2) the current $I_2$ 425 must be less than the forward bias voltage $V_f$ 447 of the body diode of the low switch M2 400 to eliminate the accumulation of the reverse recovery charge $Q_{rr}$. However, even if the body diode does forward bias, only a fractional portion of the current $I_2$ will be contributed to the reverse recovery charge $Q_{rr}$, reducing the reverse recovery charge $Q_{rr}$ for the low switch M2 400 as compared to the accumulation of the reverse recovery charge $Q_{rr}$ for a low switch M2 in which the turn-off voltage level is not gate controlled, such as the low switch M2 225 of the representative prior art power switching circuit 200.

Figure 7A:
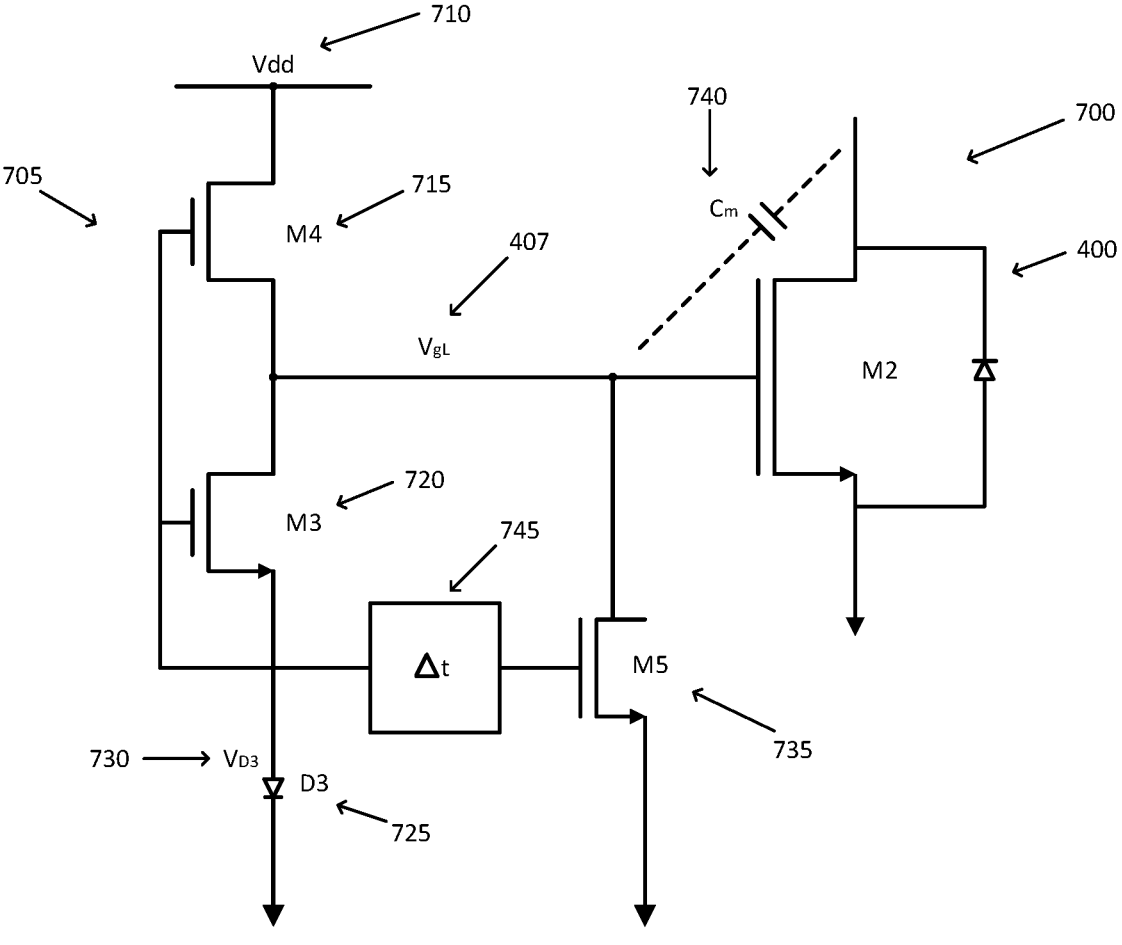
FIG. 7A shows an embodiment of the present invention, a power switching circuit with a driver stage and a parallel clamping device with a time delay circuit.
Figure 7B:
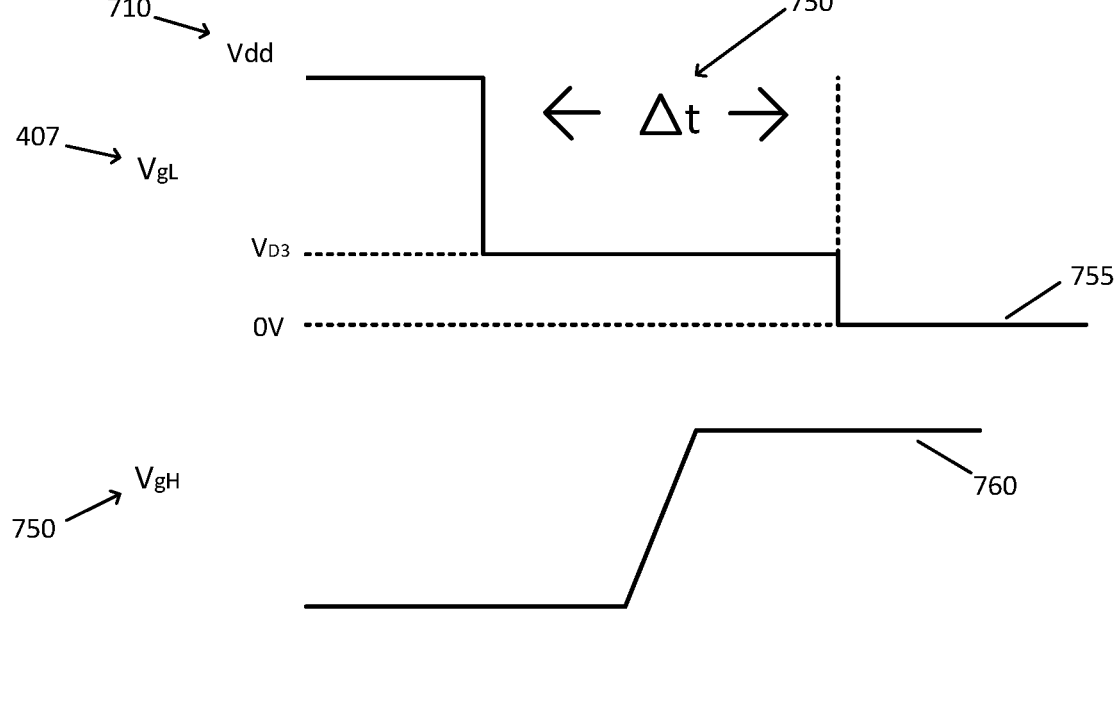
FIG. 7B shows the behavior over time of voltages in the power switching circuit of FIG. 7A.

There are several ways that this technique can be implemented into a design. FIGS. 7A and 7B show a Driver Stage M3 and M4 in series with diode D3 which sets the Vbias voltage. In addition, a parallel clamping device, M5 can be placed to pull the gate to source voltage to zero when the drain voltage begins to rise. This also helps to mitigate the M2 device from turning back on when the miller capacitance (Cm) from the drain to gate injects charge onto the gate during this voltage transient on the drain.

FIG. 7A shows an embodiment of the present invention, the power switching curcuit 700, including the low switch M2 400. In the power switching circuit 700, a driver stage 705 that includes the input for the driver stage input voltage $V_{dd}$ 710, the driver switch M4 715, the driver switch M4 720, and the driver diode D3 725, and the driver diode voltage $V_{D3}$ 730 at the connection of the driver switch M3 720 and driver diode D3 725. The driver stage 705 is used to set the bias voltage $V_{bias}$ for the low switch gate voltage $V_{gL}$ 407.

In the embodiment shown in FIG. 7A, the parallel clamping device M5 735 is shown. The parallel clamping device M5 735 is used to pull the gate-to-source voltage $V_{gL}$ 407 to 0 V when the drain voltage of the low switch M2 400 begins to rise. This action helps to prevent the low switch M2 400 from switching to the ON state when the parasitic capacitance known as the Miller capacitance $C_m$ 740 from the drain to the gate of the low switch M2 400 injects charge onto the gate of the low switch M2 400 during the rise of the voltage at the drain. The parallel clamping device M5 735 may be controlled from the driver stage 705 by a delay circuit 745.

FIG. 7B shows the behavior over time of the low switch gate voltage $V_{gL}$ 407 as the voltage curve 755 and of the high switch gate voltage $V_{gH}$ 450 as the voltage curve 760 for the embodiment shown in FIG. 7A. The low switch gate voltage $V_{gL}$ 407 begins as the driver stage input voltage $V_{dd}$ 710, and then the low switch gate voltage $V_{gL}$ 407 is changed to the driver diode voltage $V_{D3}$ 730. After a time delay $\Delta t$ introduced by the delay circuit 745, the low switch gate voltage $V_{gL}$ 407 is changed to 0 V. During the time delay delay $\Delta t$, the high switch gate voltage VgH 450 is changed to switch the high switch M1 (not shown in FIG. 7A) to the ON state. The parallel clamping device M5 735 may also be controlled by a combination of the driver stage 705 and feedback monitoring of the drain voltage of the low switch M2 400.

Figure 8A:
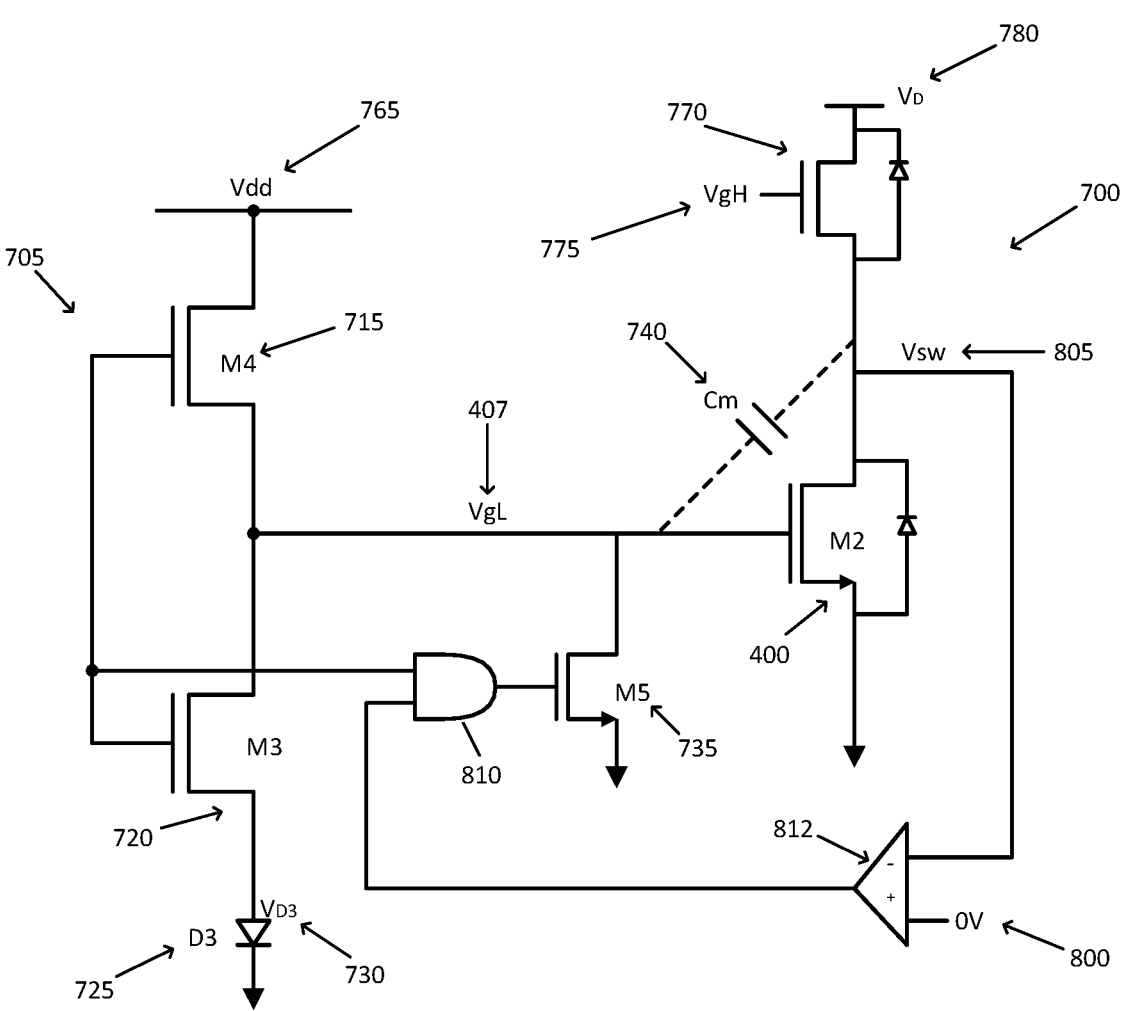
FIG. 8A shows an embodiment of the present invention, a power switching application with driver stage, a parallel clamping circuit, and feedback monitoring.
Figure 8B:
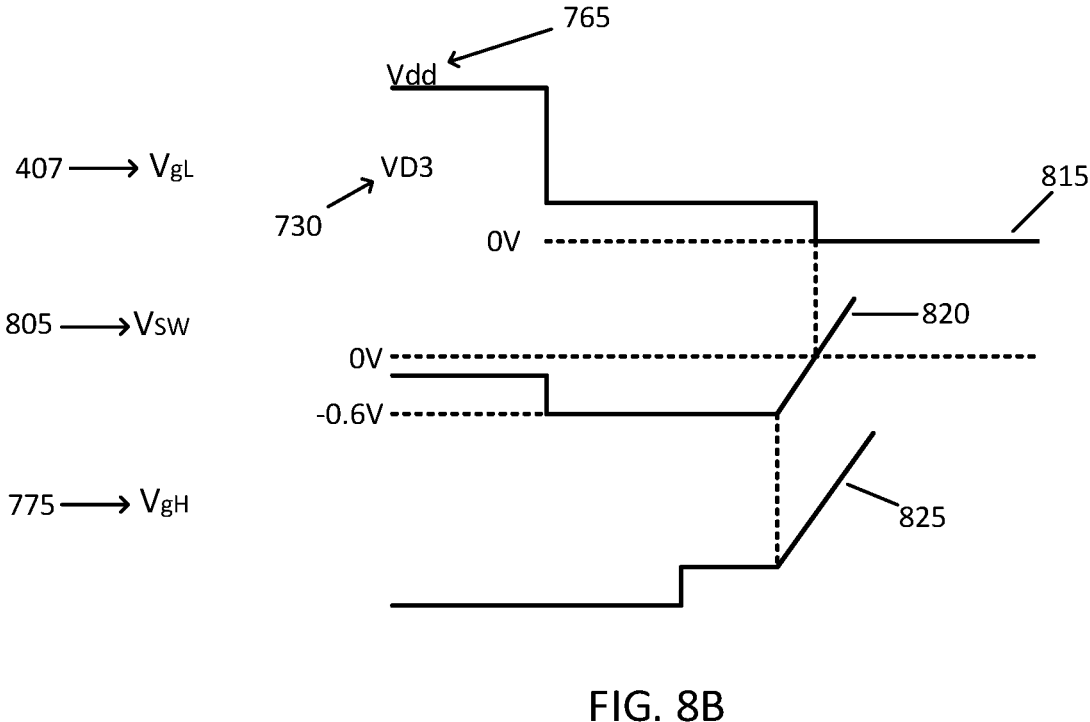
FIG. 8B shows the behavior over time of voltages in the power switching circuit of FIG. 8A.

FIGS. 8A and 8B show a latter technique which provides immediate feedback when the drain voltage of M2 begins to rise, which prevents inadvertent turn-off of M2 from the Cm capacitor. FIG. 8A shows an embodiment in which the logic gate 810 controls the gate of the parallel clamping device M5 735, where the logic gate 810 uses as input (1) the voltage at the gates of the driver switches M3 and M4 and (2) the output of the device 812. When the drain voltage of the low switch M2 400, $V_{SW}$ 805, begins to rise, the parallel clamping device M5 is switched to the ON state, and the low switch M2 400 is prevented from switching to the ON state when the Miller capacitance Cm 740 injects charge onto the gate of the low switch M2 400. FIG. 8A also shows the driver stage input voltage $V_{dd}$ 765, the high switch 770, the input for the high switch gate voltage $V_{gh}$ 775, and the high switch drain voltage $V_D$ 780.

FIG. 8B shows the behavior over time of the low switch gate voltage $V_{gL}$ 407 as the voltage curve 815, of the drain voltage of the low switch M2 400, $V_{SW}$ 805, as voltage curve 820, and of the high switch gate voltage $V_{gH}$ 775 as voltage curve 825. The low switch gate voltage $V_L$ 407 begins at the driver stage input voltage $V_{dd}$ 765, then is changed to the driver diode voltage $V_{D3}$ 730. The drain voltage of the low switch M2 400, $V_{SW}$ 805, begins at a voltage between 0 V and the representative voltage of −0.6 V and is changed to the representative voltage of −0.6 V when the low switch gate voltage $V_{gL}$ 407 is changed to the driver diode voltage $V_{D3}$ 730. Then the high switch gate voltage $V_{gH}$ 775 is changed to switch the high switch 770 to the ON state and as the high switch gate voltage $V_{gH}$ 775 rises, drain voltage of the low switch M2 400, $V_{SW}$ 805, rises. When drain voltage of the low switch M2 400, $V_{SW}$ 805, reaches 0 V, and the parallel clamping device M5 is switched to the ON state. Thus, the low switch M2 400 is prevented from switching to the ON state when the Miller capacitance $C_m$ 740 injects charge onto the gate of the low switch M2 400.

Additionally, for the embodiments shown in FIGS. 7A and 8A, other techniques can be used where the bias voltage $V_{bias}$ for the low switch gate voltage $V_{gL}$ 407 is a dynamically adjusted value that is compensated by feedback from a current sense amplifier from the low switch M2 400. This allows for greatest gate-to-reverse-sourcevoltage drive in the reverse direction.

In addition, a feedback loop can be achieved from a tap-off FET from the low switch M2 400 where a low-current diode voltage is monitored and the bias voltage $V_{bias}$ for the low switch gate voltage $V_{gL}$ 407 can be adjusted. In addition, improvements can be made to the technique of optimizing the threshold voltage $V_t$ of the low switch M2 400. By making the threshold voltage $V_t$ of the low switch M2 400, the low switch M2 400 can have more drive strength per unit area in the reverse-bias mode.

Figure 9A:
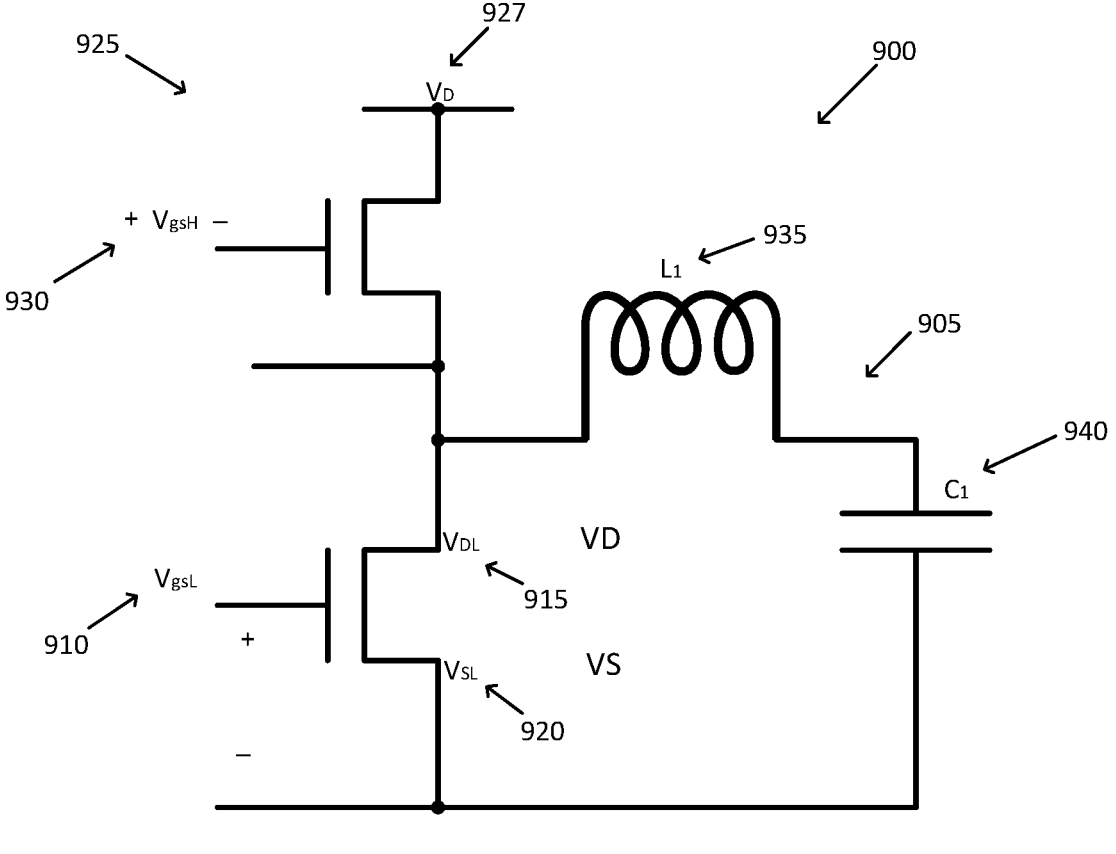
FIG. 9A shows an embodiment of the present invention, a wide-bandgap low switch.

FIG. 9A shows an embodiment of the present invention in which a wide-bandgap low switch, such as a low switch that includes gallium nitride (Ga N), is used in a power switching circuit 900, such as a low switch that includes gallium nitride (Ga N). FIG. 9A shows a wide-bandgap low switch with a low switch gate voltage $V_{gL}$ 910, a low switch drain voltage $V_{dL}$ 915, and a low switch source voltage $V_{sL}$ 920, and a high switch 925 with a high sswitch drain voltage $V_D$ 927 and a high switch gate voltage $V_{gH}$ 930. Also shown is a load 905 including the load inductor $L_1$ 935 and the load capacitor $C_1$ 940. During operation, when current flows from the low switch source 920 to the low switch drain 915 at the time during make-before-break 955, the gate-to-source voltage $V_{gsA}$ is placed at a mid-level voltage $V_{mid}$ 955. By using this embodiment, the drain-to-source voltage $V_{dsA}$ maximum negative voltage can be minimized. Use of this embodiment aids in the reduction of noise generated.

Figure 9B:
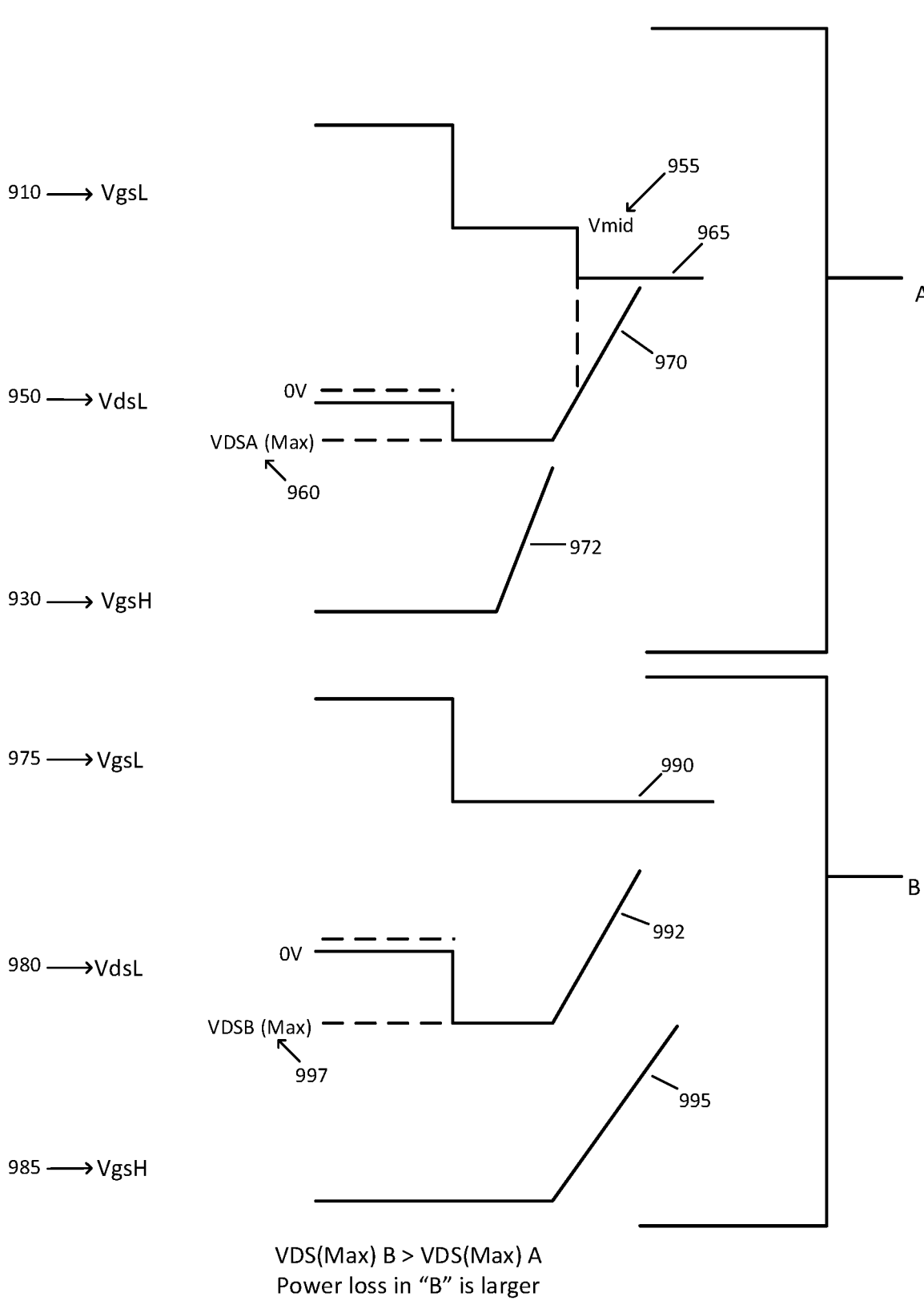
FIG. 9B shows a comparison of the behaviors over time of voltages in the switch of FIG. 9A and in a prior art switch.

FIG. 9B compares the behaviors over time of voltages in a power switching circuit including the wide-bandgap low switch of FIG. 9A (part "A" of FIG. 9B) and in a prior art power switching circuit (part "B" of FIG. 9B). Because the maximum drain-to-sorce voltage of the prior switch of part "B" is greater than the maximum drain-to-source voltage of the wide-bandgap switch of FIG. 9A, the power loss in the prior art switch of part "B" is greater than power loss of the wide-bandgap switch of FIG. 9A, an improvement over the prior art.

Figure 10:
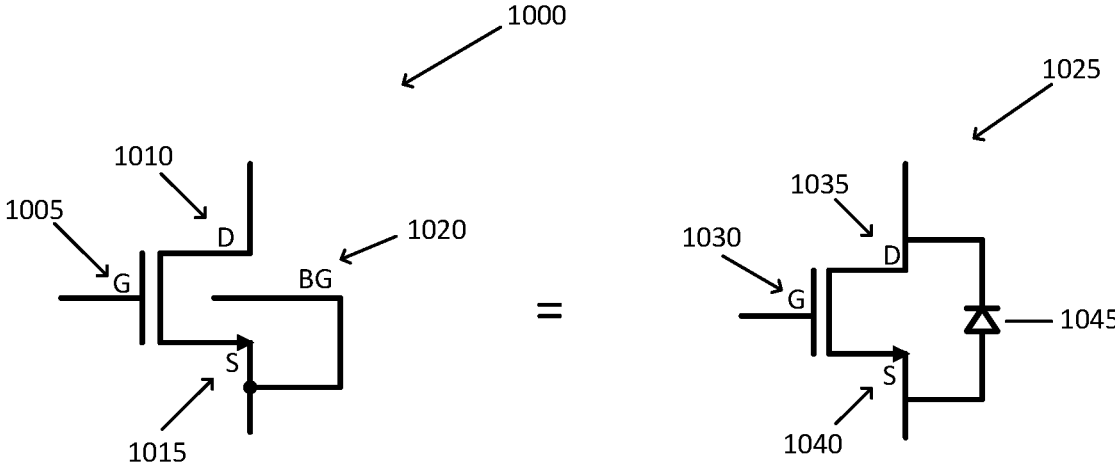
FIG. 10 shows the equivalence of a four-terminal switch and a three-terminal switch with a body diode.

FIG. 10 shows that the typical silicon or silicon carbide switch is actually a four-terminal device. In the switch 1000, having the gate G 1005, the drain D 1010, the source S 1015, and the backgate BG 1020, the backgate 1020 is tied to the source S 1015. The switch 1000 is equivalent to the switch 1025, having the gate G 1030, the drain D 1035, the source S 1040, and the body diode 1045.

Figure 11A:
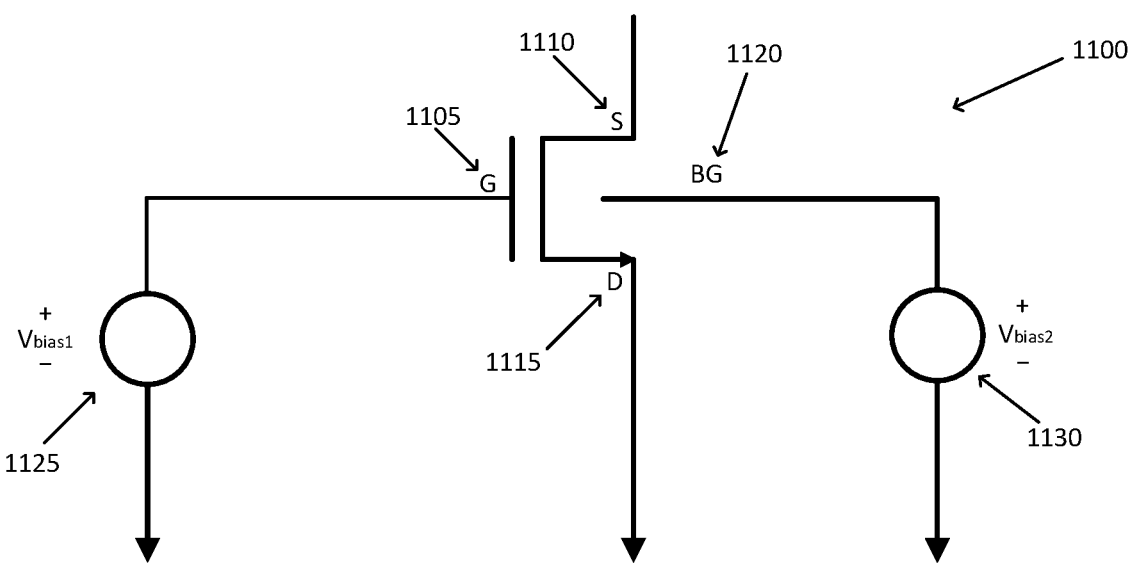
FIG. 11A shows an embodiment of the present invention, a four-terminal switch.

FIG. 11A shows an embodiment of the present invention, a four-terminal switch 1100 including silicon or silicon carbide and having the gate G 1105, the source S 1110, the drain D 1115, the backgate BG 1120, a voltage source for the gate bias voltage $V_{bias1}$ 1125, and a voltage source for the backgate bias voltage $V_{bias2}$ 1130. Both the gate bias voltage $V_{bias1}$ 1125 and the backgate bias voltage $V_{bias2}$ 1130 can be adjusted to further reduce the ON-state resistance of the switch 1100 when current flows from the source S 1110 to the drain D 1115 when the switch is in the reverse-bias mode. To achieve this, the gate-to-source voltage can be placed at a mid-level voltage and the backgte bias voltage $V_{bias2}$ 1130 can also be placed at a mid-level voltage, which reduces the threshold voltage, increasing the drive and reducing the current of the switch 1100 with the current flowing from the source S 1110 to the drain D 1115 when the switch is in the reverse-bias mode. Any combination of the gate bias voltage $V_{bias1}$ 1125 and the backgate bias voltage $V_{bias2}$ 1130 can be used.

Figure 11B:
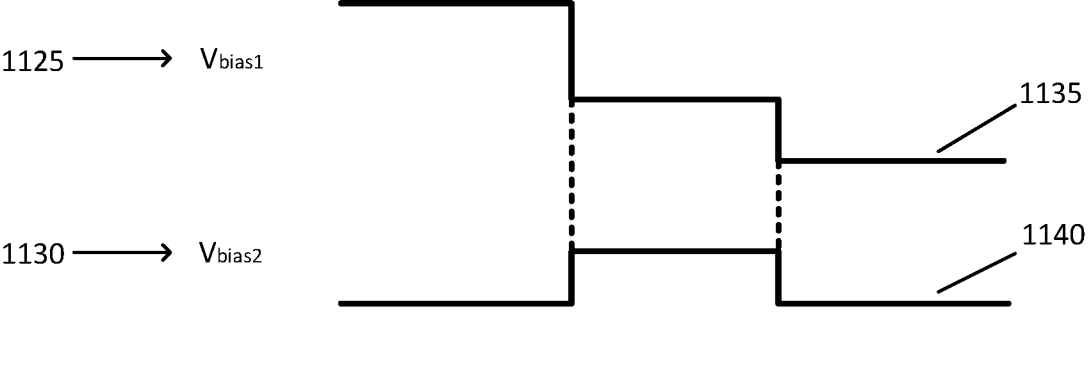
FIG. 11B shows the one type of behavior over time of voltages in the four-terminal switch of FIG. 11A.

FIG. 11B shows the behavior over time of the gate bias voltage $V_{bias1}$ 1125, shown as voltge curve 1135, and the backgate bias voltage $V_{bias2}$ 1130, shown as voltage curve 1140, for the switch 1100 when the gate bias voltage $V_{bias1}$ 1125 and the backgate bias voltage $V_{bias2}$ 1130 are changed at the same times.

Figure 11C:
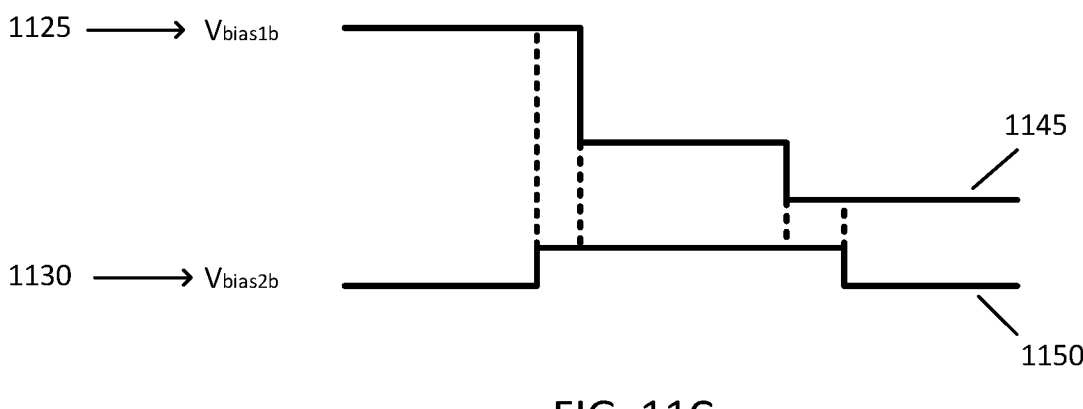
FIG. 11C shows another type of behavior over time of voltages in the four-terminal switch of FIG. 11A.

FIG. 11C shows the behavior over time of the gate bias voltage $V_{bias1}$ 1125, shown as voltage curve 1145, and the backgate bias voltage $V_{bias2}$ 1130, shown as voltage curve 1150, for the switch 1100. This is another timing embodiment of FIG. 11B, in which the backgate bias voltage $V_{bias2}$ 1130 is activated to a voltage backgate bias voltage $V_{bias2}$ 1130 prior to gate bias voltage $V_{bias1}$ 1125 transitioning from a high state to a mid state. Additionally, the backgate bias voltage $V_{bias1}$ 1130 transitions from a mid state to a low state after gate bias voltage $V_{bias1}$ 1125 transitions from a mid state to a low state. By controlling the voltage of gate bias voltage $V_{bias1}$ 1125 and backgate bias voltage $V_{bias2}$ 1130 in this condition provides a stable shift in threshold voltage for the gate bias voltage $V_{bias1}$ 1125 when it transitions from a high state to a mid state and from mid state to low state, including zero (0V). It is also possible to maintain backgate bias voltage $V_{bias2}$ 1130 in a non-zero state, thus it does not have to dynamically switch.

The approach taught herein can also be used with Silicon Carbide applications (SiC), Gallium Nitride, or Gallium Arsenide. Any combination of bias voltage and threshold voltage can be set either positive or negative in value that meets the requirements of off-state in the forward direction and on-state in the negative direction.

The approach taught herein can also be used in any combination of configurations, such as high-side drive, low-side drive, high- and low-side, or one or more FETs in any combination.

The approach taught herein can also be used in any combination of current or voltage switching or current and voltage switching, such as power regulation, one or more switches for line termination, DC motor drivers, induction motor drivers, transducer drivers, solid-state fuse switches, battery management, AC-to-DC power conversion, DC-to-AC power conversion, or power correction.

Any combination of bias voltage and threshold voltage can be set either positive or negative in value that meets the requirements of off-state in the forward direction and on-state in the negative direction.

Any combination of transitions from on voltage to bias voltage that meets the requirements of on- to off-state in the forward direction and on-state in the negative direction is included in the present invention. The transitions can also be either step functions, linear graded, or non-linear graded transitions.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of." As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step, or a limitation) or group of integers (e.g., feature(s), element(s), characteristic(s), property(ies), method/process(s) steps, or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about," "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the devices and/or methods disclosed and claimed herein can be made and executed without undue experimentation in light of the present disclosure. While the devices and/or methods of this invention have been described in terms of particular embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope, and concept of the invention as defined by the appended claims.

Furthermore, no limitations are intended to the details of construction or design herein shown, other than as described in the claims below. It is therefore evident that the particular embodiments disclosed above may be altered or modified and all such variations are considered within the scope and spirit of the disclosure. Accordingly, the protection sought herein is as set forth in the claims below.

Modifications, additions, or omissions may be made to the systems and apparatuses described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order.

To aid the Patent Office, and any readers of any patent issued on this application in interpreting the claims appended hereto, applicants wish to note that they do not intend any of the appended claims to invoke 35 U.S.C. § 112(f) as it exists on the date of filing hereof unless the words "means for" or "step for" are explicitly used in the particular claim.

What is claimed is:

1. A method for reducing or eliminating current or voltage transients in a device comprising:

providing the device, wherein the device comprises a transistor with a gate, a drain, a body diode and a backgate, wherein a reverse turn-on voltage of the transistor is less than a forward threshold voltage of the body diode;

providing a driver stage and a parallel clamping device connected to the gate of the transistor;

applying a selected backgate bias voltage to the backgate of the transistor to lower a reverse-threshold voltage of the transistor;

controlling the gate of the transistor, wherein the gate is turned off to a non-zero value by the driver stage, and the gate is pulled to a zero value by the parallel clamping device in a presence of a voltage that crosses above zero in the drain;

thereby reducing or eliminating current or voltage transients in the device.

2. The method of claim 1, further comprising selecting a threshold voltage of the transistor, the reverse-threshold voltage of the transistor, or both to optimize controlling the gate.

3. The method of claim 1, wherein the transistor is formed in or on silicon, silicon carbide, gallium nitride, or gallium arsenide.

4. The method as recited in claim 1, wherein the gate is pulled to the zero value by the parallel clamping device in the presence of the voltage that crosses above zero in the drain and a delay circuit.

5. The method as recited in claim 1, wherein the transistor comprises a first transistor and controlling the gate of the first transistor is not based on a gate voltage of a second transistor connected to the drain of the first transistor.

6. The method as recited in claim 1, wherein the driver stage and the parallel clamping device are not connected to a pulse width modulation signal.

7. A method for reducing or eliminating current or voltage transients in a power converter comprising:

providing the power converter comprising a first switch comprising a first transistor with a gate and a source, a second switch comprising a second transistor with a gate, a drain, a body diode and a backgate, a driver stage and a parallel clamping device, wherein the source of the first transistor is connected to the drain of the second transistor, the gate of the second transistor is connected to the driver stage and the parallel clamping device, and a reverse turn-on voltage of the second transistor is less than a forward threshold voltage of the body diode; and applying a selected backgate bias voltage to the backgate of the second transistor to lower a reverse-threshold voltage of the second transistor;1 controlling the switch, wherein, (1) a turn-off voltage of the second transistor is a bias voltage greater than zero and less than a threshold voltage of the second transistor and (2) the turn-off voltage is applied to the gate of the second transistor by the driver stage to turn off the second transistor, preventing the forward current flow through the second transistor;

wherein in a presence of a voltage that crosses above zero in the drain of the second transistor, applying a zero voltage to the gate of the second transistor by the parallel clamping device, thereby reducing or eliminating current or voltage transients.

8. The method of claim 7, further comprising selecting the threshold voltage, the turn-off voltage, or both to optimize controlling the switch.

9. The method of claim 7, wherein the second transistor comprises silicon, silicon carbide, gallium nitride, or gallium arsenide.

10. The method as recited in claim 7, wherein the gate is pulled to the zero value by the parallel clamping device in the presence of the voltage that crosses above zero in the drain the second transistor and a delay circuit.

11. The method as recited in claim 7, wherein the driver stage and the parallel clamping device are not controlled by a gate voltage of the second transistor.

12. The method as recited in claim 7, wherein the driver stage and the parallel clamping device are not connected to a pulse width modulation signal.

13. A method for reducing or eliminating current or voltage transients from accumulated reverse recovery charge in a switch comprising:

providing the switch, wherein the switch comprises a transistor with a gate, a body diode and a backgate; and controlling the switch, wherein in a presence of a forward current, (1) a turn-off voltage of the transistor is a bias voltage that is greater than zero and less than a threshold voltage of the transistor and (2) the turn-off voltage is applied to the gate, such that the forward current will not flow through the transistor; and wherein in a presence of a reverse current, (1) a reverse turn-on voltage of the transistor is less than a forward threshold voltage of the body diode and (2) applying a backgate bias voltage to the backgate to lower a reverse-threshold voltage of the transistor, thereby reducing or eliminating current or voltage transients from accumulated reverse recovery charge.

14. The method of claim 13, further comprising selecting the forward threshold voltage, the reverse-threshold voltage, or both to optimize controlling the switch.

15. The method of claim 13, wherein the transistor is formed in or on silicon, silicon carbide, gallium nitride, or gallium arsenide.

16. A switch comprising:

a transistor comprising a gate, a drain, a body diode and a backgate, wherein a reverse turn-on voltage is lowered when a selected backage bias voltage is applied to the backgate, a reverse current will not flow through the body diode, a reverse recovery charge will not accumulate at the body diode, and the reverse turn-on voltage is less than a forward threshold voltage of the body diode;

wherein, (1) a turn-off voltage of the transistor is a bias voltage greater than zero and less than a threshold voltage of the transistor and (2) the turn-off voltage is applied to the gate to turn off the transistor, and a forward current will not flow through the transistor; and wherein in a presence of a voltage that crosses above zero in the drain of the transistor, applying a zero voltage to the gate, thereby reducing or eliminating current or voltage transients.

17. The switch of claim 16, further comprises selecting the threshold voltage, the turn-off voltage, or both to optimize controlling the switch.

18. The switch of claim 16, wherein the transistor is formed in or on silicon, silicon carbide, gallium nitride, or gallium arsenide.

19. The switch as recited in claim 16, wherein the gate is pulled to the zero voltage by a parallel clamping device in the presence of the voltage that crosses above zero in the drain and a delay circuit.

20. The switch as recited in claim 16, wherein the transistor comprises a first transistor and controlling a gate of the first transistor is not based on a gate voltage of a second transistor connected to the drain of the first transistor.

21. The switch as recited in claim 16, wherein a driver stage and a parallel clamping device are not connected to a pulse width modulation signal.

22. A power converter comprising:

a first switch comprising a first transistor comprising a gate and a source;

a second switch comprising a second transistor comprising a gate, a drain, a body diode and a backgate, wherein the drain is connected to the source of the first transistor, a reverse turn-on voltage of the second transistor is lowered when a selected backgate bias voltage is applied to the backgate, and the reverse turn-on voltage of the second transistor is less than a forward threshold voltage of the body diode, and;

a driver stage connected to the gate of the second transistor;

a clamping device connected to the gate of the second transistor;

wherein, (1) a turn-off voltage of the second transistor is a bias voltage that is greater than zero and less than a threshold voltage of the second transistor and (2) the turn-off voltage is applied to the gate of the second transistor by the driver stage to turn off the second transistor, and a forward current will not flow through the second transistor; and wherein in a presence of a voltage that crosses above zero in the drain of the second transistor, applying a zero voltage to the gate of the second transistor by the clamping device, thereby reducing or eliminating current or voltage transients.

23. The power converter as recited in claim 22, wherein the gate is pulled to the zero value by the clamping device in the presence of the voltage that crosses above zero in the drain of the second transistor and a delay circuit.

24. The power converter as recited in claim 22, wherein the driver stage and the clamping device are not controlled by a gate voltage of a second transistor.

25. The power converter as recited in claim 22, wherein the driver stage and the clamping device are not connected to a pulse width modulation signal.

26. A switch comprising:

a transistor comprising a gate, a body diode, and a backgate;

wherein in a presence of a forward current (1) a turn-off voltage of the transistor is a bias voltage that is greater than zero and less than a threshold voltage of the transistor and (2) when the turn-off voltage is applied to the gate, the forward current will not flow through the transistor; and wherein in a presence of a reverse current, (1) a reverse turn-on voltage of the transistor is less than a forward threshold voltage of the body diode and (2) applying a backgate bias voltage to the backgate to lower a reverse-threshold voltage of the transistor, thereby reducing or eliminating current or voltage transients.

* * * * *